United States Patent [19]

Swirbel et al.

[11] Patent Number: 5,489,489
[45] Date of Patent: Feb. 6, 1996

[54] SUBSTRATE HAVING AN OPTICALLY TRANSPARENT EMI/RFI SHIELD

[75] Inventors: Thomas J. Swirbel, Davie; Reginald L. Barnes, Boynton Beach, both of Fla.

[73] Assignee: Motorola, Inc., Schaumburg, Ill.

[21] Appl. No.: 278,120

[22] Filed: Jul. 21, 1994

[51] Int. Cl.⁶ ........................................ B32B 9/00
[52] U.S. Cl. ................ 428/615; 428/639; 428/642; 428/647; 428/209; 428/210; 428/901
[58] Field of Search .................................. 428/209, 210, 428/615, 647

[56] References Cited

U.S. PATENT DOCUMENTS 4,670,097  6/1987  Abdalla et al. ...................... 156/659.1
4,835,061  5/1989  Ohta et al. ............................ 428/469

*Primary Examiner*—Patrick J. Ryan
*Assistant Examiner*—Kam F. Lee
*Attorney, Agent, or Firm*—Dale W. Dorinski

[57] ABSTRACT

A substrate having an optically transparent EMI/RFI shield. A transparent substrate (10) has a thin film metallization pattern (20) on one surface, and some of the pattern is covered with an optically transparent EMI/RFI shield (32). The shield comprises a vapor deposited layer of indium-tin oxide on the substrate surface and on the metallization pattern. The indium-tin oxide is optically transparent. It is patterned to expose one portion (34) of the metallization pattern and to cover a second portion (32) of the metallization pattern. The shield is electrically connected to a part (26) of the metallization pattern that is covered, thus providing electrical shielding and transparency.

7 Claims, 3 Drawing Sheets

SUBSTRATE HAVING AN OPTICALLY TRANSPARENT EMI/RFI SHIELD

CROSS REFERENCE TO RELATED APPLICATIONS

This application is related to pending U.S. application Ser. No. 08/010,224, filed Jan. 27, 1993, entitled "Method for Fabricating Electrode Patterns", by Swirbel, et al., and assigned to Motorola, Inc.

1. Technical Field

This invention relates in general to electromagnetic shielding, and more particularly to optically transparent electromagnetic shields.

2. Background

The trend in portable communication devices has been to use liquid crystal displays to aid the user in enabling the operating features of the device. As the number of features expand, the amount of information to be displayed increases, and the size of the display increases. The introduction of virtual displays into portable communication devices requires unique packaging technology. The shortcoming of any display which transmits or receives visible radiation is that it is very difficult to shield the device from electromagnetic interference (EMI), also known as radio frequency interference (RFI), without effecting the optical requirements of the display. EMI/RFI is well known in the industry to affect the operation of communication devices. The most troublesome interferences occur in the radio frequency range of the electromagnetic spectrum. The problem is further compounded when the display requires a substrate with electrical runner geometries on the order of 10 microns or less. Some displays require large openings in the portable communication device housing, creating a problem for leakage of EMI/RFI into or out of the device, resulting in increased electromagnetic shielding problems. Passive devices such as a liquid crystal display are not typically regarded as a component which would require shielding from EMI or RFI. However, in medium to high rate displays the signal frequencies are usually greater than 1 KHz and, therefore, important. Displays with the display drivers mounted directly on the display glass have active circuitry that needs to be protected. Also, the large displays used in small portable products form a sizable percentage of the overall surface area of the product, and now creates a large window which allows noise signals to adversely effect the performance of the product. To solve this type of noise leakage, the current art teaches placing a wire mesh in front of the display. However, this is unworkable for very high resolution devices. Others have sought to solve the shielding problem by adhering a plastic film coated with a very thin layer of silver, copper, or gold to the front of a display. This does not shield the circuitry used to drive the display, and falls well short of a true solution to the problem. Obviously, there is a need for improvements to the current art that will provide a shield from radio frequency interference, yet be optically transparent.

SUMMARY OF THE INVENTION

Briefly, according to the invention, there is provided a substrate having an optically transparent EMI/RFI shield. The substrate has a thin film metallization pattern on one surface, and the pattern is covered with an optically transparent EMI/RFI shield. The shield comprises a vapor deposited layer of indium-tin oxide on the substrate surface and on the metallization pattern, and it is patterned to reveal a first portion of the metallization pattern and to cover a second portion of the metallization pattern.

DETAILED DESCRIPTION OF THE PREFERRED EMBODIMENT

Figure 1:
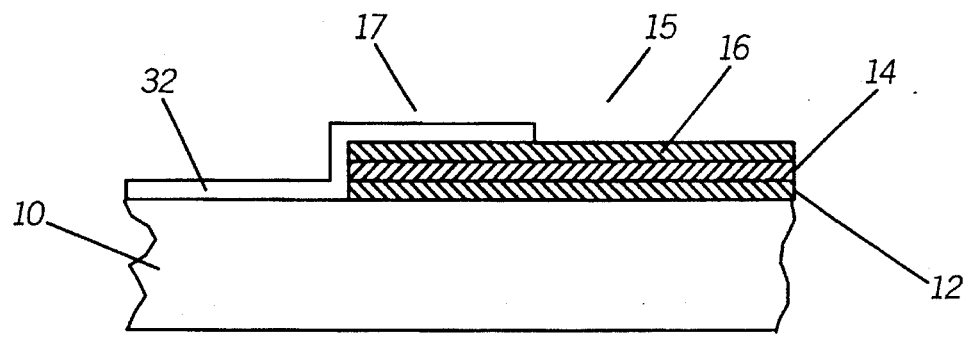
FIG. 1 is a cross-sectional view through section 1—1 of FIG. 1, in accordance with the invention.

This application describes a package and manufacturing processes for making the package which overcomes the problems with the current art. The package comprises a shielded substrate providing optical transparency, EMI/RFI shielding, and capable of very fine pitch circuitry. While the specification concludes with claims defining the features of the invention that are regarded as novel, it is believed that the invention will be better understood from a consideration of the following description in conjunction with the drawing figures. For sake of drawing clarity, the sizes of some of the features have been purposely exaggerated in scale.

Figure 2:
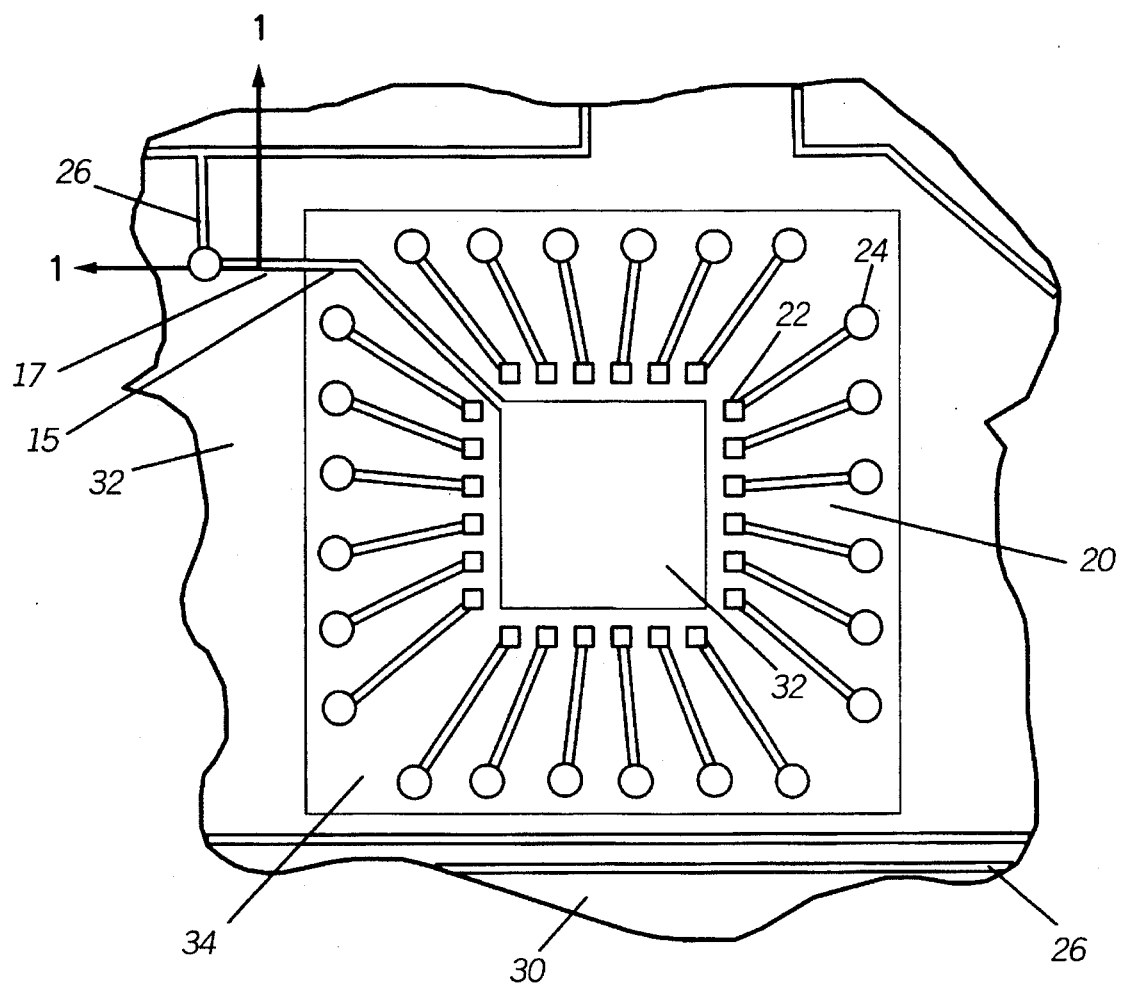
FIG. 2 is a plan view of a circuit layout in accordance with the invention.

Referring now to FIGS. 1 and 2, a substrate 10 is typically made from a transparent material such as glass or quartz. A first layer 12 of a reactive metal, typically chrome, is deposited directly on the substrate by a process such as sputtering. Other reactive metals that are well known to be "glue" metals may be substituted for chrome, such as aluminum, nickel or titanium. A second layer of metal 14, for example copper, is then deposited directly on the first layer 12. The combined metallization layers (12 and 14) are then patterned using photolithography techniques, to create a circuitry pattern 20 on the substrate surface. The top layer of the metallized circuitry pattern 20 may have an overlay layer 16 of a noble metal, such as gold, with, optionally, additional metal layers such as electroplated copper between the second layer 14 and the overlay layer 16. As shown in the drawings, one embodiment of the circuitry pattern 20 is for mounting a flip-chip integrated circuit on the substrate. The pattern has an array of chip mounting pads 22 that are connected to additional mounting pads 24 by conductive runners. The circuitry pattern also has additional circuit traces 26 (runners, pads, etc.) that are on other portions of the substrate surface. An optically transparent EMI/RFI shield 30 covers portions 32 of the substrate, while revealing other portions 34. Because the shield covers portions 32 of the substrate, it also covers some of the circuit traces 26 and is therefore electrically connected to them. The portions 34 of the substrate that are revealed may contain a first portion 15 of the metallized circuitry pattern 20 that is also revealed, while those portions 32 of the substrate that are covered by the shield may contain a second portion 17 of the metallized circuitry pattern that is also covered by the shield. An electronic component such as an integrated circuit (not shown), is attached to the chip mounting pads 22 by, for example, the well known flip-chip mounting scheme. The drawing shows the shield 30 formed with revealed areas in a square pattern for purposes of illustration, and one skilled in the art will appreciate that many other variations of the pattern shape may be envisioned, for example, the shield may be interdigitated with some of the circuit traces to bring it nearer to the chip mounting pads 22 and the mounting pads 24.

Figure 3:
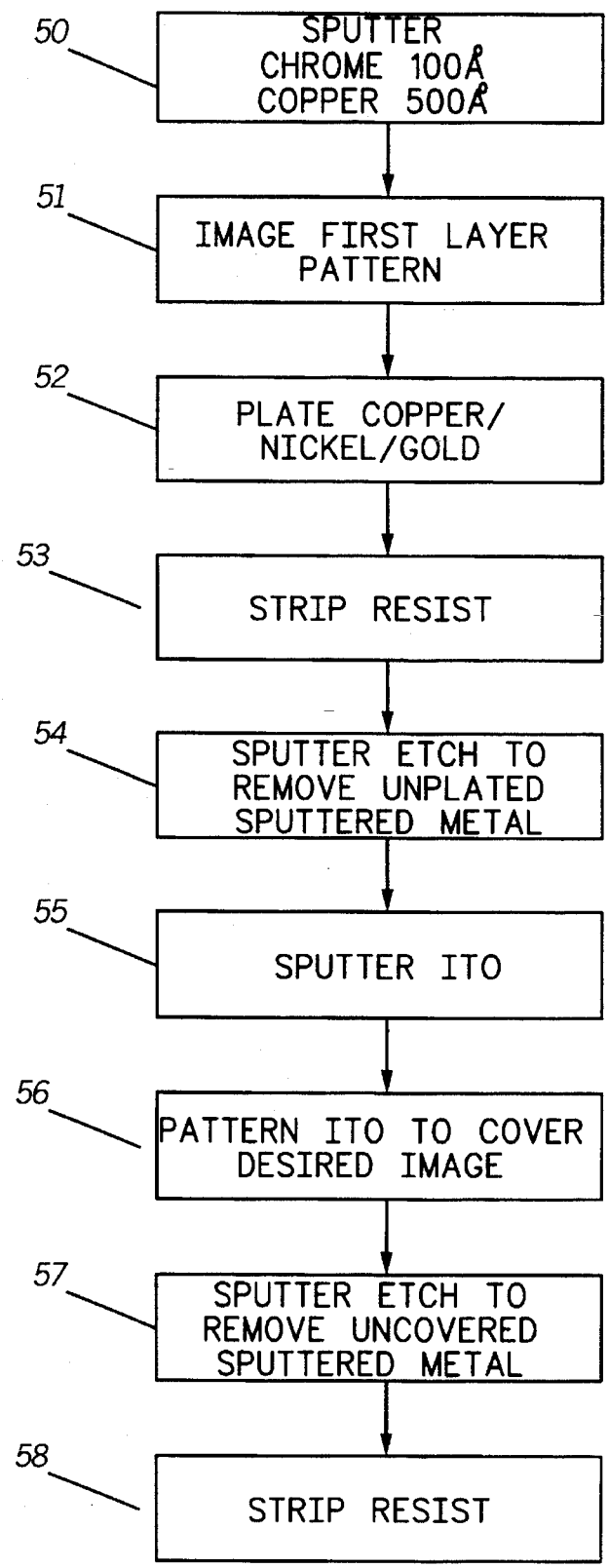
FIG. 3 is a process flow diagram used to fabricate a preferred embodiment of the invention.

Having described the structure of the instant invention, the process used to fabricate the structure will now be illustrated. This process incorporates some aspects of the traditional thin film technology processes of vacuum deposition. In the preferred embodiment, sputtering is employed as the method of vacuum depositing metal films, but other methods such as evaporating or reactive sputtering may also be used. Referring now to FIG. 3, a substrate, typically glass, is prepared for the deposition process. In step 50 first layer of a reactive metal, typically about 100 Å thick, is sputtered directly onto the glass surface. Chrome is the preferred metal when sputtering on glass, but other reactive metals that are known to be "glue" metals may be substituted, such as aluminum, nickel or titanium. A second layer of metal, for example copper, is sputtered directly over the chrome layer. A copper thickness on the order of about 500 Å was found to work best, but variations of this thickness are within the ken of one versed in the art. The combined metallization layer (chrome/copper) is then patterned using photolithography techniques in step 51, to create a circuitry pattern on the substrate surface. In this example, AZ 4620 liquid photoresist from American Hoescht was coated onto the metallized substrate, and the resist was then photoimaged using hard contact lithography and developed in a suitable liquid developer. Photoresist feature sizes as small as 8 microns were formed on the sputtered chrome/copper layer. Subsequent layers of copper, nickel, and gold were then electroplated directly on portions of the chrome/copper layer is step 52 to form the circuitry pattern consisting of flip chip pads, solder pads, and runners. The photoresist was then removed (53) in a resist stripping solution, exposing unplated portions of the chrome/copper layer. The exposed copper and chrome were then removed (54) by sputter etching the substrate in a sputtering chamber, using argon ions to sputter etch the metal off of the substrate. The gold overlayer protects the underlying pattern from being attacked. Conventional wet etching techniques using peroxide/sulfuric acid blends for copper and hydrochloric acid or potassium permanganate for chrome were not effective because they did not provide the required anisotropy to prevent the fine pitch geometries from being undercut and therefore losing adhesion to the substrate. At this point, a substrate having a high resolution metallization pattern has been formed, the metallization pattern being a thin film of chrome, copper, nickel and gold.

The optically transparent EMI/RFI shield will now be formed and patterned by depositing a transparent conductive layer. Two approaches have been found to be effective for depositing this transparent conductive layer on the substrate in the desired regions. The first is to sputter deposit a layer of indium-tin oxide (ITO) reactively from an indium-tin target (55). Reactive sputtering is well known in the art, and is accomplished in this case by introducing oxygen into the sputtering chamber during the sputtering process, thereby converting the indium and tin to indium oxide and tin oxide. The ITO layer is sputtered over the entire substrate, thus the ITO is on the bare glass substrate and the previously developed metallization pattern. The ITO layer typically should have a sheet resistivity of less than 1 ohm/sq. (typically a layer of about 2500 Å thickness is required), and should be optically transparent. Photolithography is then performed in step 56, masking those regions which are to be covered with the transparent shield. The selected portions of the metallization pattern which are not to be covered by the shield are left exposed, that is to say, not covered with photoresist. The substrate is then sputter etched (57) in a manner similar to that previously described, using the argon ions to etch away the exposed ITO, thereby revealing selected portions of the metallization pattern. This technique of dry sputter etching has been found to be particularly useful in creating the fine resolution required, and without damaging the underlying metallization pattern. The photoresist is then stripped away (58), leaving the patterned, optically transparent EMI/RFI shield in place on the substrate surface.

Figure 4:
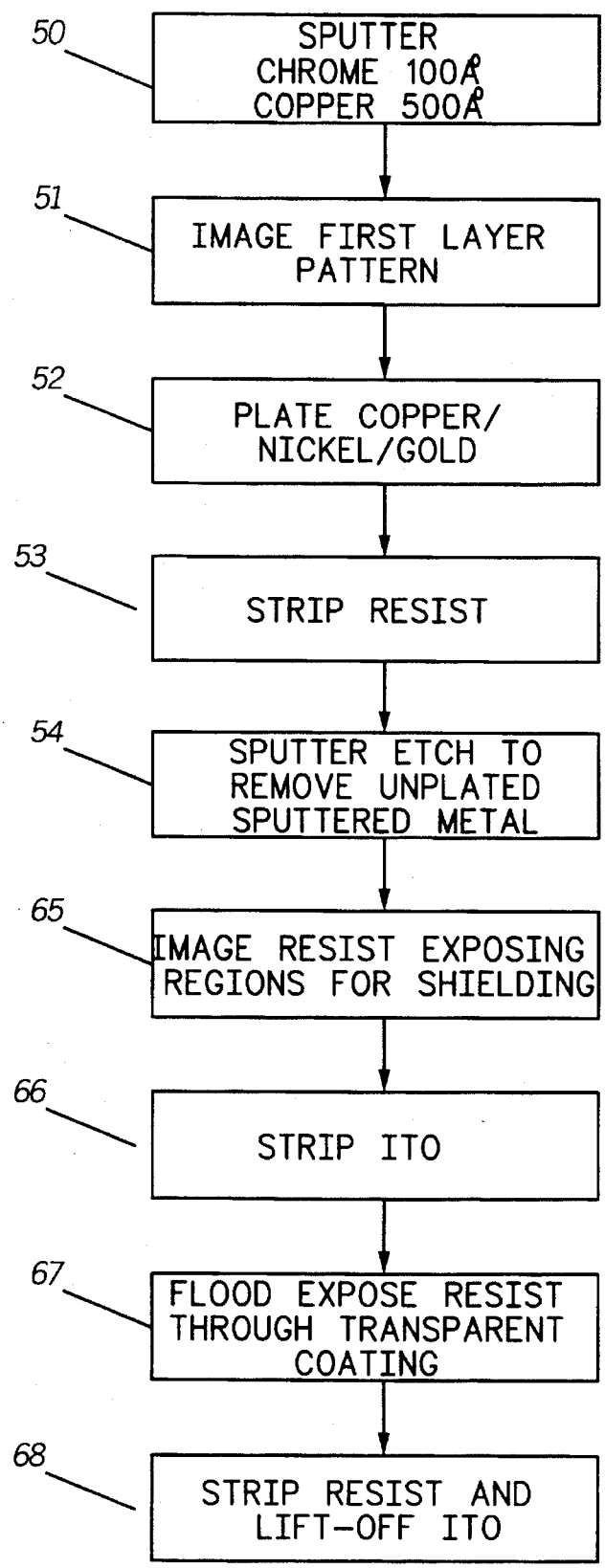
FIG. 4 is a process flow diagram used to fabricate an alternate embodiment of the invention.

An alternate process shown in FIG. 4 has also been found to be effective for creating the patterned ITO layer, using a lift-off technique where a positive resist is imaged on the substrate. One lift-off technique is outlined in application Ser. No. 08/010,224 by Swirbel et. al., incorporated herein by reference. Steps 50–54 remain as previously described. In step 65, a layer of photoresist is applied over the high resolution metallization pattern that was formed. The desired pattern is created in the resist by photolithography and developing, and step 66 deposits a thin layer of ITO over the entire substrate and the patterned resist layer. The photoresist is then flood exposed (67) with light through the thin, transparent layer of ITO, and the resist is then stripped. During step 68, the stripping process lifts the resist off along with the unwanted ITO, leaving the desired ITO pattern on the substrate.

An electronic component can now be added to the substrate. A preferred embodiment finds an integrated circuit flip-chip bonded to the metallization pattern defined on the substrate. Other types of components can also be added, but the invention finds a most suitable application in those areas requiring high density interconnections, such as flip chips. The substrate can then be further attached to a printed circuit board using a number of methods. The transparent shield allows the substrate to transmit light, but yet provide EMI/RFI shielding.

In summary, the process sequences outlined above result in excellent adhesion at all interfaces and results in solderable surfaces at the required pads. The thin, transparent layer of ITO patterned on the substrate provides EMI/FRI shielding, while retaining the optical transparency needed in the substrate. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A substrate having an optically transparent EMI/RFI shield, comprising:

a substrate having a thin film metallization pattern on a major surface; and an optically transparent EMI/RFI shield comprising a vapor deposited layer of indium-tin oxide on the substrate major surface and on the metallization pattern, the shield patterned to reveal a first portion of the metallization pattern and to cover a second portion of the metallization pattern.

2. The substrate as described in claim 1, wherein the shield is electrically connected to the second portion of the metallization pattern.

3. The substrate as described in claim 1, wherein the thin film metallization pattern is vapor deposited.

4. The substrate as described in claim 1, further comprising an electronic device attached to the first portion of the metallization pattern.

5. The substrate as described in claim 1, wherein the substrate forms a portion of a display device.

6. A substrate for a flip-chip, having an optically transparent EMI/RFI shield, comprising:

a substrate having a thin film metallization pattern on a major surface, the pattern comprising a layer of vapor deposited chrome on the substrate, a second layer of copper on the chrome, and a third layer of gold on the copper;

an optically transparent EMI/RFI shield comprising;

an indium-tin oxide layer vapor deposited on the substrate major surface and on a first portion of the metallization pattern;

the indium-tin oxide layer electrically connected to the first portion of the metallization pattern; and the indium-tin oxide layer revealing a second portion of the metallization pattern; and an electronic device electrically attached to the second portion of the metallization pattern.

7. The substrate as described in claim 1, wherein the electronic device is a flip-chip integrated circuit.

* * * * *